United States Patent
Shibata et al.

(10) Patent No.: US 8,142,611 B2
(45) Date of Patent: Mar. 27, 2012

(54) SEMICONDUCTOR-CHIP EXFOLIATING DEVICE AND SEMICONDUCTOR-DEVICE MANUFACTURING METHOD

(75) Inventors: Motojiro Shibata, Yokohama (JP);
Akira Ushijima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 519 days.

(21) Appl. No.: 12/048,371

(22) Filed: Mar. 14, 2008

(65) Prior Publication Data

US 2008/0227239 A1      Sep. 18, 2008

(30) Foreign Application Priority Data

Mar. 16, 2007   (JP) ................................ 2007-067974

(51) Int. Cl.
*B29C 63/00*   (2006.01)
(52) U.S. Cl. ........ 156/716; 156/247; 156/248; 156/249; 156/701; 156/717; 438/110; 425/190; 425/193; 425/437; 425/544
(58) Field of Classification Search .................. 438/110; 425/190, 193, 437, 544; 156/247–249, 716–717
See application file for complete search history.

(56) References Cited

U.S. PATENT DOCUMENTS

| | | | | |
|---|---|---|---|---|
| 4,556,362 A * | 12/1985 | Bahnck et al. | ............. | 414/744.3 |
| 4,718,967 A * | 1/1988 | Irie | ............. | 156/379.6 |
| 4,859,269 A * | 8/1989 | Nishiguchi | ............. | 156/361 |
| 5,098,501 A * | 3/1992 | Nishiguchi | ............. | 156/275.5 |
| 5,351,872 A * | 10/1994 | Kobayashi | ............. | 228/6.2 |
| 5,447,266 A * | 9/1995 | Misono | ............. | 228/102 |
| 5,589,029 A * | 12/1996 | Matsui et al. | ............. | 156/765 |
| 5,755,373 A * | 5/1998 | Nakamura | ............. | 228/6.2 |
| 5,848,670 A * | 12/1998 | Salzman | ............. | 187/272 |
| 6,106,222 A * | 8/2000 | Tsuji et al. | ............. | 414/811 |
| 6,139,676 A * | 10/2000 | Fernandez | ............. | 156/765 |
| 6,201,306 B1 * | 3/2001 | Kurosawa et al. | ............. | 257/783 |

(Continued)

FOREIGN PATENT DOCUMENTS

CN    1638068 A    7/2005

(Continued)

OTHER PUBLICATIONS

Office Action mailed Nov. 16, 2010, in Japanese Patent Application No. 2007-067974 filed Mar. 13, 2007 (with English language translation).

*Primary Examiner* — Thao Le
*Assistant Examiner* — Eric Jones
(74) *Attorney, Agent, or Firm* — Oblon, Spivak, McClelland, Maier & Neustadt, L.L.P.

(57) ABSTRACT

A semiconductor-chip exfoliating device for exfoliating a semiconductor chip 1 from an adhesive sheet 6 is provided. The device includes a backup holder 28 for holding the adhesive sheet 6 so that semiconductor chips 1 turn upward, a pair of needle pins arranged on a backside of the holder 28 to lift off the adhesive sheet 6 from the holder 28 through throughholes 31a, 31b in the holder 28 and a sliding unit 33 arranged on the backside of the holder 28 to slide one needle pin 30b in a direction to depart from the other needle pin 30a. By the sliding unit 33, the interval between the needle pins 30a, 30b can be changed so as to cope with a variation of semiconductor chips 1, 1A.

10 Claims, 5 Drawing Sheets

U.S. PATENT DOCUMENTS

| | | | |
|---|---|---|---|
| 6,305,677 B1* | 10/2001 | Lenz | 269/13 |
| 6,386,815 B1* | 5/2002 | Tawara | 414/416.1 |
| 6,526,651 B1* | 3/2003 | Hwang | 29/740 |
| 6,555,418 B2* | 4/2003 | Kurosawa et al. | 438/118 |
| 6,622,954 B2* | 9/2003 | Komuro et al. | 242/432.2 |
| 6,673,386 B2* | 1/2004 | Komyoji et al. | 427/8 |
| 6,709,543 B2* | 3/2004 | Kurosawa | 156/765 |
| 6,774,011 B2* | 8/2004 | Nakazawa et al. | 438/464 |
| 6,887,317 B2* | 5/2005 | Or et al. | 118/728 |
| 6,943,094 B2* | 9/2005 | Koopmans | 438/462 |
| 7,160,392 B2* | 1/2007 | Shang et al. | 118/728 |
| 7,198,479 B2* | 4/2007 | Lu et al. | 425/437 |
| 7,238,258 B2* | 7/2007 | Park et al. | 156/765 |
| 7,265,035 B2* | 9/2007 | Honma et al. | 438/464 |
| 7,306,695 B2* | 12/2007 | Kasai | 156/702 |
| 7,470,120 B2* | 12/2008 | Cheung | 425/190 |
| 7,665,204 B2* | 2/2010 | Cheung et al. | 29/762 |
| 2002/0019074 A1* | 2/2002 | Nakazawa et al. | 438/107 |
| 2002/0069952 A1* | 6/2002 | Kurosawa | 156/91 |
| 2002/0088892 A1* | 7/2002 | Komuro et al. | 242/432.3 |
| 2005/0116548 A1* | 6/2005 | Oisugi et al. | 310/12 |
| 2005/0274457 A1* | 12/2005 | Cheung et al. | 156/344 |
| 2006/0093698 A1* | 5/2006 | Lu et al. | 425/437 |
| 2006/0137828 A1* | 6/2006 | Fujisawa et al. | 156/584 |
| 2006/0205239 A1* | 9/2006 | Koga et al. | 438/795 |
| 2006/0252233 A1* | 11/2006 | Honma et al. | 438/464 |
| 2007/0125491 A1* | 6/2007 | Yonemizu et al. | 156/285 |
| 2008/0086874 A1* | 4/2008 | Cheung et al. | 29/762 |
| 2008/0227239 A1* | 9/2008 | Shibata et al. | 438/110 |
| 2009/0041954 A1* | 2/2009 | Koga et al. | 427/596 |
| 2010/0038253 A1* | 2/2010 | Frodis et al. | 205/118 |

FOREIGN PATENT DOCUMENTS

| | | |
|---|---|---|
| JP | 02-184046 | 7/1990 |
| JP | 10-112465 | 4/1998 |
| JP | 2003-133263 | 5/2003 |

* cited by examiner

SEMICONDUCTOR-CHIP EXFOLIATING DEVICE AND SEMICONDUCTOR-DEVICE MANUFACTURING METHOD

BACKGROUND OF THE INVENTION

1. Field of the Invention

The present invention relates to device and method for manufacturing semiconductor devices. More particularly, the invention relates to semiconductor-chip exfoliating device and method that are constructed so as to lift off an adhesive sheet having a semiconductor chip by means of lift-off pins whereby one semiconductor chip can be exfoliated from the adhesive sheet.

2. Description of the Related Art

Japanese Patent Publication Laid-open (heisei) No. 10-112465 discloses a prior art apparatus for manufacturing semiconductor devices. In the apparatus, a semiconductor chip adhered to an adhesive film (dicing sheet) is lifted up by lift-off pins (needle pins) to thereby exfoliate the semiconductor chip from the adhesive sheet. The so-exfoliated semiconductor chip is used to manufacture a semiconductor device.

In the above-mentioned apparatus, a single semiconductor chip is lifted up by using a plurality of needle pins.

SUMMARY OF THE INVENTION

However, the above-mentioned manufacturing apparatus for semiconductor devices is not thoughtful of the following points.

In exfoliating one semiconductor chip from the adhesive sheet, it is preferable to allow the lift-off pin to lift off chip's margins on both sides of the semiconductor chip as a target. The knocking-up of the lift-off pins against chip's margins on both sides of the chip allows the semiconductor to be exfoliated from the adhesive sheet with ease, also allowing the exfoliated chip to be broken with difficulty.

In the above-mentioned apparatus, however, the interval between the lift-off pins is constant in spite of a variety of semiconductor chips in size to be adhered to the adhesive sheet. Therefore, if it is required to exfoliate one of semiconductor chips from the adhesive sheet, the semiconductor chips each having a different size from that of the normal semiconductor chip, it is necessary to replace an original lift-off unit for the normal semiconductor chip to another lift-off unit where the interval between the lift-off pins is changed for such a different semiconductor chip.

It is apt to take time and work in exchanging one lift-off unit to another one in the manufacturing process, causing the productivity of the semiconductor devices to be reduced.

Under such a situation, an object of the present invention is to provide a semiconductor-chip exfoliating device capable of making it ease to exfoliate a semiconductor chip from an adhesive sheet throughout semiconductor chips of difference sizes. Another object of the present invention is to provide a semiconductor-chip exfoliating method of exfoliating one semiconductor chip from the adhesive sheet through the use of the above semiconductor-chip exfoliating device.

In order to attain the former object, according to the present invention, there is provided a semiconductor-chip exfoliating device for exfoliating a semiconductor chip from an adhesive sheet to which a plurality of semiconductor chips are adhered, comprising: a holder for holding the adhesive sheet so that the semiconductor chips turn upward; at least two through-holes formed in the holder; at least two lift-off pins arranged on a backside of the holder to lift off the adhesive sheet from the holder through the through-holes; and a sliding unit arranged on the backside of the holder to slide at least one lift-off pin in a direction to depart from the other lift-off pin to thereby change an interval between the lift-off pins.

In order to attain the latter object, according to the present invention, there is also provided a semiconductor-device manufacturing method, comprising the steps of: preparing a semiconductor-chip exfoliating device including a holder for holding the adhesive sheet so that a plurality of semiconductor chips turn upward, at least two through-holes formed in the holder, at least two lift-off pins arranged on a backside of the holder to lift off the adhesive sheet from the holder through the through-holes, and a sliding unit arranged on the backside of the holder to slide at least one lift-off pin in a direction to depart from the other lift-off pin to thereby change an interval between the lift-off pins; allowing the holder to hold the adhesive sheet so that the semiconductor chips turn upward; and raising the lift-off pins to lift off the adhesive sheet from the holder, whereby one semiconductor chip can be exfoliated from the adhesive sheet.

With the above semiconductor-chip exfoliating device and semiconductor-device manufacturing method, by adjusting the interval between the lift-off pins corresponding to the size of a target semiconductor chip, it is possible to make the semiconductor chip easy to be exfoliated from the adhesive sheet, although there is a difference in size of the semiconductor chips adhered to the adhesive sheet.

BRIEF DESCRIPTION OF THE DRAWINGS

FIGS. 7A and 7B are longitudinal sectional views of the semiconductor-chip exfoliating device, in which FIG. 7A shows one state where one semiconductor chip is raised by a leading needle pin and FIG. 7B shows another state where one semiconductor chip is raised by the needle pins.

DETAILED DESCRIPTION OF THE PREFERRED EMBODIMENTS

An embodiment of the present invention will be described with reference to attached drawings.

Figure 1:
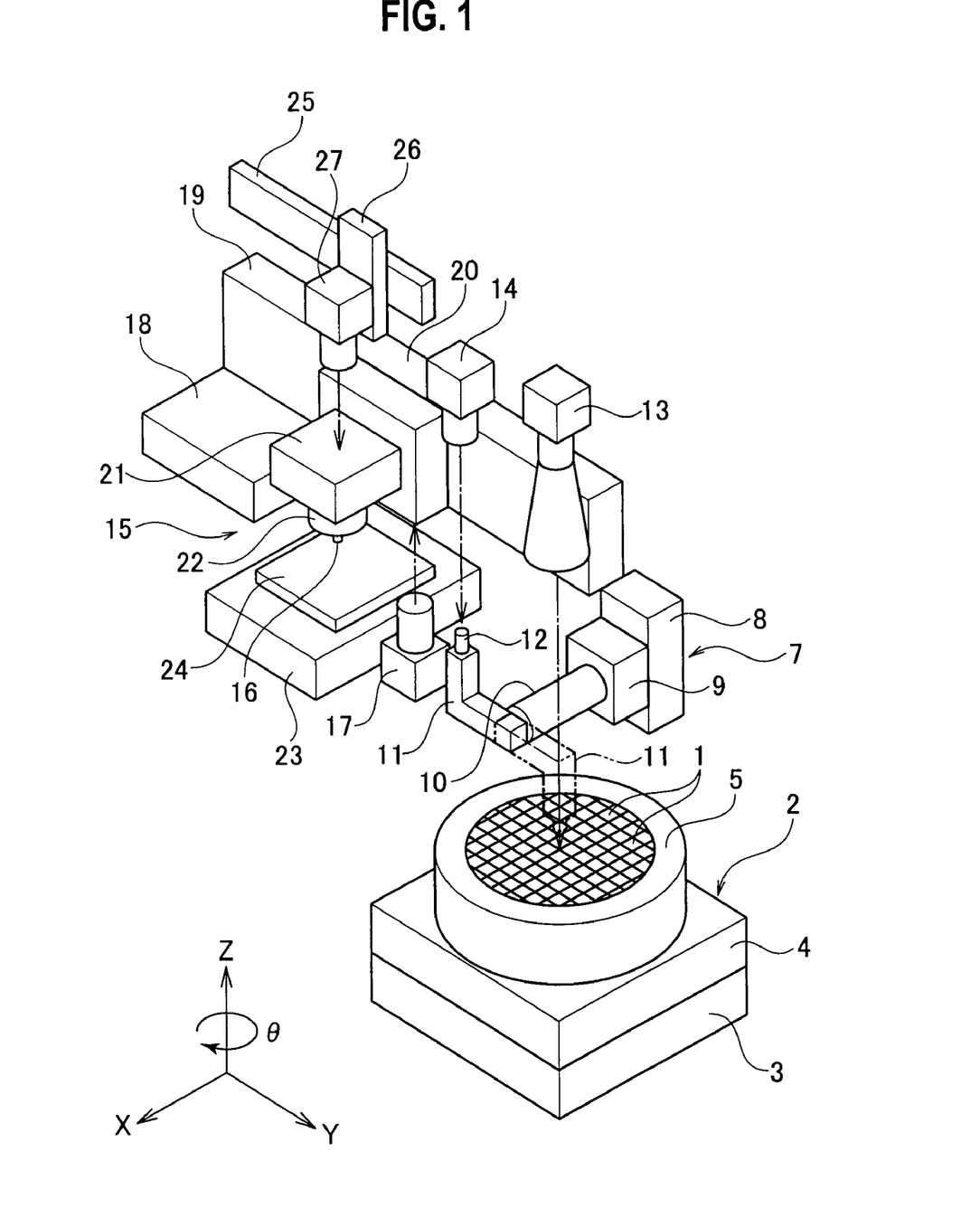
FIG. 1 is a perspective view of a semiconductor-device manufacturing apparatus including a semiconductor-chip exfoliating device in accordance with an embodiment of the present invention.

As shown in FIG. 1, a manufacturing apparatus for semiconductor devices includes a wafer stage 2 for mounting a semiconductor wafer (not shown) thereon. The wafer stage 2 comprises a base 3, a first table 4 and a second table 5 both mounted on the base 3. The second table 5 carries an adhesive sheet 6 to which a plurality of semiconductor chips 1 are adhered. The first table 4 is movable in both directions of X-axis and Y-axis. While, the second table 5 is rotatable about Z-axis in the direction of θ. For convenience of explanation, the first table 4 and the second table 5 will be referred to as "XY-axes table 4" and "θ table 5" respectively, hereinafter. The semiconductor chips 1 are produced by cutting off a piece of semiconductor wafer, which is adhered to the adhesive sheet (so-called "dicing sheet") 6, by means of a dicing saw (not shown) vertically and horizontally. After cutting off the wafer, the adhesive sheet 6 is expanded so as to produce a gap between the adjoining semiconductor chips 1.

A pickup reversing unit 7 is arranged over the θ table 5. The pickup reversing unit 7 includes a guide 8, a third table 9 slidable along the guide 8 in the direction of Z-axis, an attachment 10 fixed to the third table 9 and an L-shaped pickup reversing tool 11 rotatably mounted on an end of the attachment 10. For convenience of explanation, the third table 9 will be referred to as "Z-axis table 9" hereinafter. The pickup reversing tool 11 is arranged so as to be rotatable about a joint point to the attachment 10 within an angular range of 180 degrees between one illustrated position with solid lines and another illustrated position with broken lines. The pickup reversing tool 11 is also provided, at a tip thereof, with a pickup head 12 for carrying a semiconductor chip 1 in absorption.

Over the pickup reversing tool 11, there are a first camera 13 and a second camera 14. In operation, the first camera 13 is adapted so as to take a picture of the semiconductor chip 1 being mounted on the θ table 5. Based on imaging signals from the first camera 13, the semiconductor chip 1 carried in absorption by the pickup head 12 is identified. In detail, the positioning of the θ-table 5 in the directions of X-axis, Y-axis and θ is determined base on the imaging signals outputted from the first camera 13. On the other hand, the second camera 14 is adapted so as to take a picture of the semiconductor chip 1 being carried in absorption by the pickup head 12. The shooting of the second camera 14 against the semiconductor chip 1 is carried out when the pickup reversing tool 11 is rotated and consequently located in a position shown with solid lines of FIG. 1. Based on imaging signals of the second camera 14, a bonding head 15 is driven to allow a bonding tool 16 to receive a semiconductor chip 1 from the pickup head 12. The so-delivered semiconductor chip 1 is picturized by a third camera 17.

The bonding head 15 includes a base 18. A first table 19 is attached to the base 18 so as to be slidable in the direction of X-axis. A second table 20 is attached to the first table 19 so as to be slidable in the direction of Y-axis. Further, a third table 21 is attached to the second table 20 so as to be slidable in the direction of Z-axis. For convenience of explanation, the first table 19, the second table 20 and the third table 21 will be referred to as "X-axis table 19", "Y-axis table 20" and "Z-axis table 21", respectively. A fourth table 22 is attached to the Z-table 21 so as to be rotatable about Z-axis in the direction of θ. The fourth table 22 will be also referred to "θ table 22" after. The θ table 22 is provided with the above bonding tool 16. Thus, the bonding tool 22 is movable in the directions of X-axis, Y-axis Z-axis and θ, respectively.

Below the bonding head 15, there is a bonding stage 23 which is movable in the direction of X-axis. A substrate 24 is mounted on the bonding stage 23. The semiconductor chip 1 delivered to the bonding tool 16 is installed on the substrate 24.

A guide 25 is arranged above the bonding stage 23. A table 26 is attached to the guide 25 so as to be slidable in the direction of Y-axis. A fourth camera 27 is attached to the so-called "Y-axis" table 26 so as to be movable in the direction of Z-axis. The fourth camera 27 is adapted so as to take a picture of a semiconductor chip 1 mounted on the substrate 24. Thus, the fourth camera 27 is movable in the directions of X-axis, Y-axis and Z-axis relatively to the substrate 24 on the bonding stage 23.

Figure 2:
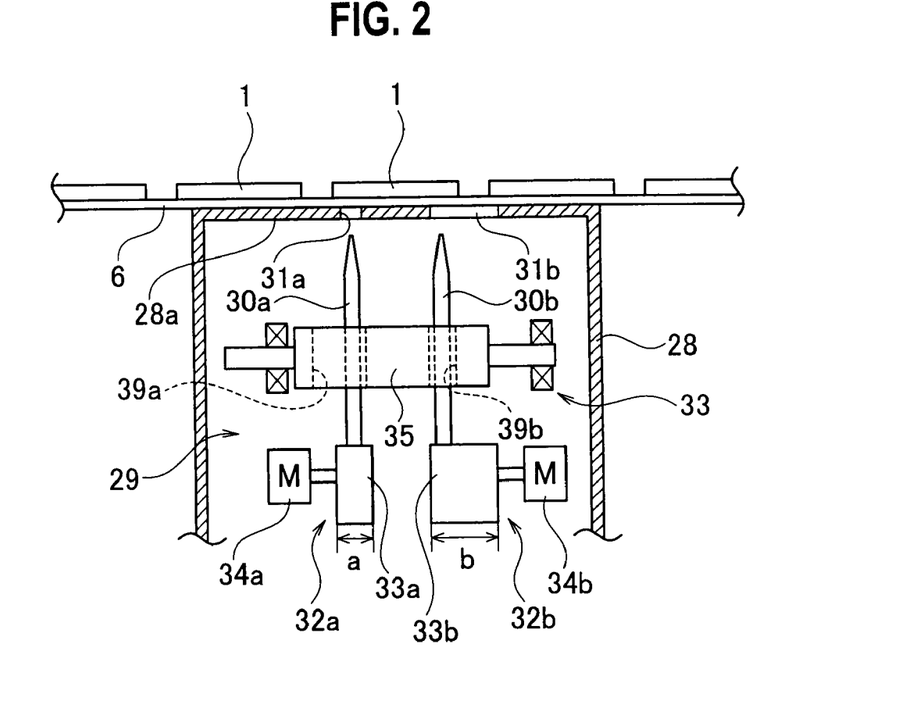
FIG. 2 is a longitudinal sectional view of a semiconductor-chip exfoliating device of FIG. 1.
Figure 3:
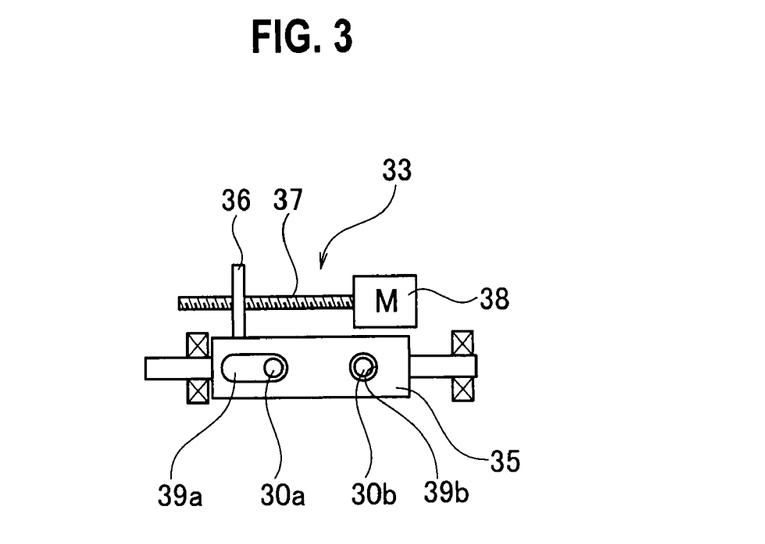
FIG. 3 is a plan view of the lift-off unit of FIG. 2.

FIG. 2 shows a semiconductor-chip exfoliating device forming the semiconductor-device manufacturing device. Inside the θ table 5, as shown in FIGS. 2 and 3, there are a backup holder 28 (as a holder of the invention) in the form of a hollow cylinder, a lift-off unit 29 accommodated in the backup holder 28 and a decompressor (not shown) for reducing pressure in the backup holder 28.

The backup holder 28 is adapted so as to be slidable in the θ table 5 in both directions of X-axis and Y-axis, together with the lift-off unit 29 accommodated in the holder 28. The backup holder 28 has a top wall 28a opposed to the lower surface of the adhesive sheet 6 through a slight gap. In the backup holder 28, the top wall 28a is formed with through-holes 31a, 31b through which later-mentioned needle pins 30a, 30b (as lift-off pins of the invention) move in and out. The through-hole 31a is shaped to be a circular hole, while the through-hole 31b is shaped to be an elongated hole. The through-hole 31a is positioned to be an extension of the through-hole 31b in the longitudinal direction.

In operation, the lift-off unit 29 lifts off a semiconductor chip 1 by the needle pins 30a, 30b to exfoliate the chip 1 from the adhesive sheet 6. The lift-off unit 19 includes the above needle pins 30a, 30b, shuttle mechanisms 32a, 32b and a sliding unit 33.

The needle pins 30a, 30b have respective one ends opposed to the through-holes 31a, 31b and the other ends abutting on eccentric cams 33a, 33b, respectively. When the needle pins 30a, 30b reciprocate in their axial direction to allow the respective ends to project from the through-holes 31a, 31b, one semiconductor chip 1 is lifted up together with the adhesive sheet 6.

The shuttle mechanisms 32a, 32b are provided to reciprocate the needle pins 30a, 30b in the axial direction and comprise the above cams 33a, 33b abutting on the other ends of the needles pins 30a, 30b and motors 34a, 34b connected to the cams 33a, 33b, respectively. The cam 33a is formed with a width "a" smaller than a width "b" of the cam 33b. When the motors 34a, 34b are driven to rotate the cams 33a, 33b, the needle pins 30a, 30b reciprocate in the axial direction. Not-shown urging means, such as springs, are attached to the needle pins 30a, 30b. The urging means urge the pins 30a, 30b in the direction to abut their other ends on the cams 33a, 33b, respectively.

The lift-off timing of the needle pins 30a, 30b is switchable between an operation mode of the same timing and another operation mode of different timings. When the former mode of the same timing is selected, the motors 34a, 34b are driven at the same timing, so that the needle pins 30a, 30b are lifted up at the same timing. On the other hand, when the later mode of the different timings is selected, the motors 34a, 34b are driven at the different timing, so that the needle pins 30a, 30b are lifted up one by one with a time difference.

The sliding unit 33 is constructed so as to slide the needle pin 30b in the direction to change an interval between the needle pin 30a and the needle pin 30b. The sliding unit 33 includes a slide shaft 35 perpendicular to the needle pins 30a, 30b, a female screw part 36 fixed to the slide shaft 35, a ball screw shaft 37 screw-engaged with the female screw part 36 and a motor 38 connected to the ball screw shaft 37.

The slide shaft 35 is formed with through-holes 39a, 39b into which the needle pins 30a, 30b are inserted. The through-hole 39a for the needle pin 30a is shaped to be an elongated hole. The through-hole 39b for the needle pin 30b is shaped to be a circular hole having an inner diameter somewhat larger than the outer diameter of the needle pin 30b. The through-hole 39b is positioned to be an extension of the through-hole 39a in the longitudinal direction.

The operation of exfoliating the semiconductor chip 1 from the adhesive sheet 6 with use of the lift-off unit 29 will be described below. When a semiconductor chip 1 to be exfoliated is determined based on the shooting result by the first camera 13, the backup holder 28 is moved to a position beneath the semiconductor chip 1 on determination.

After the backup holder 28 reaches the position beneath the target semiconductor chip 1, the above decompressor is started to drive. Consequently, air inside the backup holder 28 is sucked in the decompressor and simultaneously, outside air is also sucked in the backup holder 28 through the through-holes 31a, 31b. With this air suction into the backup holder 28 via the through-holes 31a, 31b, the adhesive sheet 6 is absorbed onto the top wall 28a of the back up holder 28.

Figure 4:
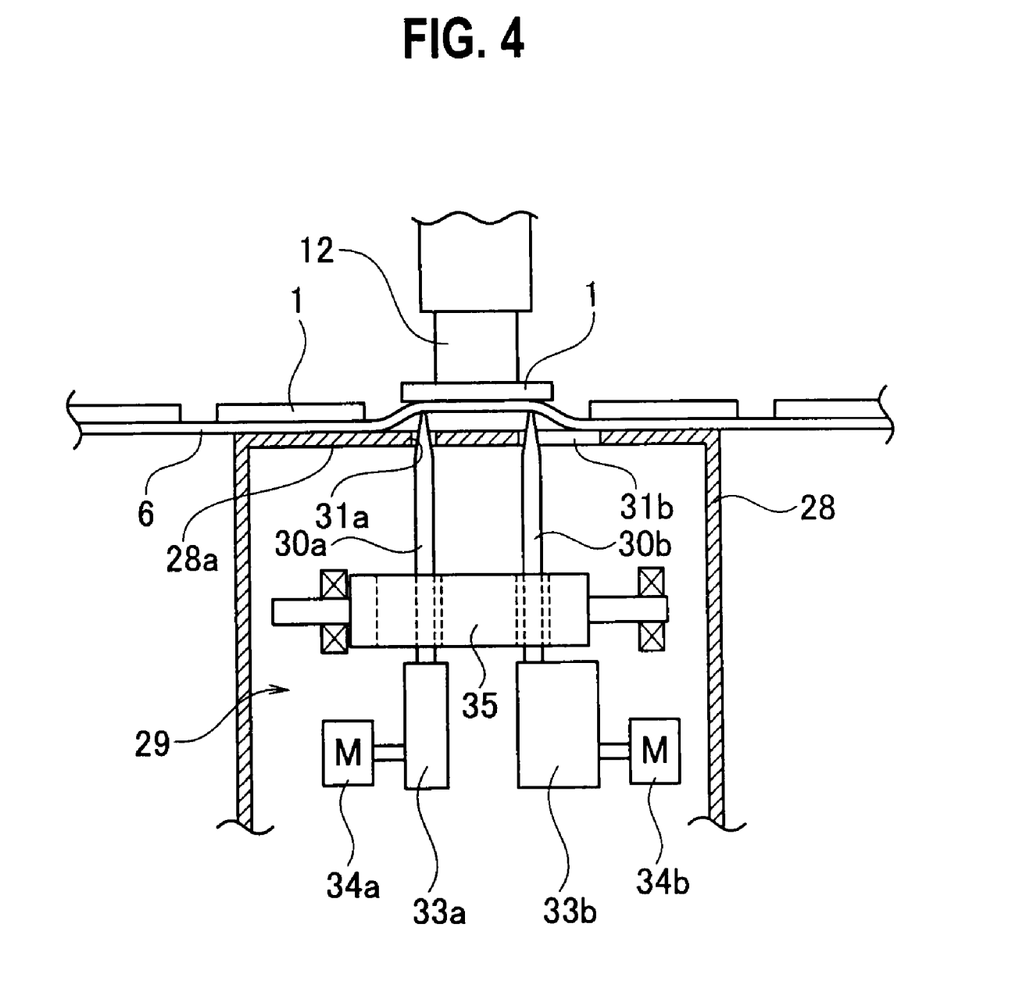
FIG. 4 is a longitudinal sectional view showing a state where one semiconductor chip is raised together with the adhesive sheet by a pair of needle pins.

After a predetermined time has passed since the decompression was started by the decompressor, the motors 34a, 34b are driven to rotate the cams 33a, 33b, causing the needle pins 30a, 30b to be pushed up, as shown in FIG. 4. The tips of the needle pins 30a, 30b pushed up by the cams 33a, 33b rise through the through-holes 31a, 31b and lift off one semiconductor chip 1 while being adhered to the adhesive sheet 6. Then, the adhesive sheet 6 just under the so-pushed semiconductor chip 1 is partially expanded to weaken the bonding property between the semiconductor chip 1 and the adhesive sheet 6, making the chip 1 easy to be exfoliated from the adhesive sheet 6.

Corresponding to the size of the semiconductor chip 1, the interval between the needle pins 30a, 30b is established so that they can lift off chip's margins on both sides of the semiconductor chip 1.

Further, in the timing synchronous with the lifting operation of the needle pins 30a, 30b, the pickup head 12 is moved to a position above the semiconductor chip 1 and successively, it is carried in absorption by the pickup head 12.

The semiconductor chip 1 carried in absorption by the pickup head 12 is delivered to the bonding tool 16 of the bonding head 15 and subsequently installed on the substrate 24 mounted on the bonding stage 23.

Figure 5:
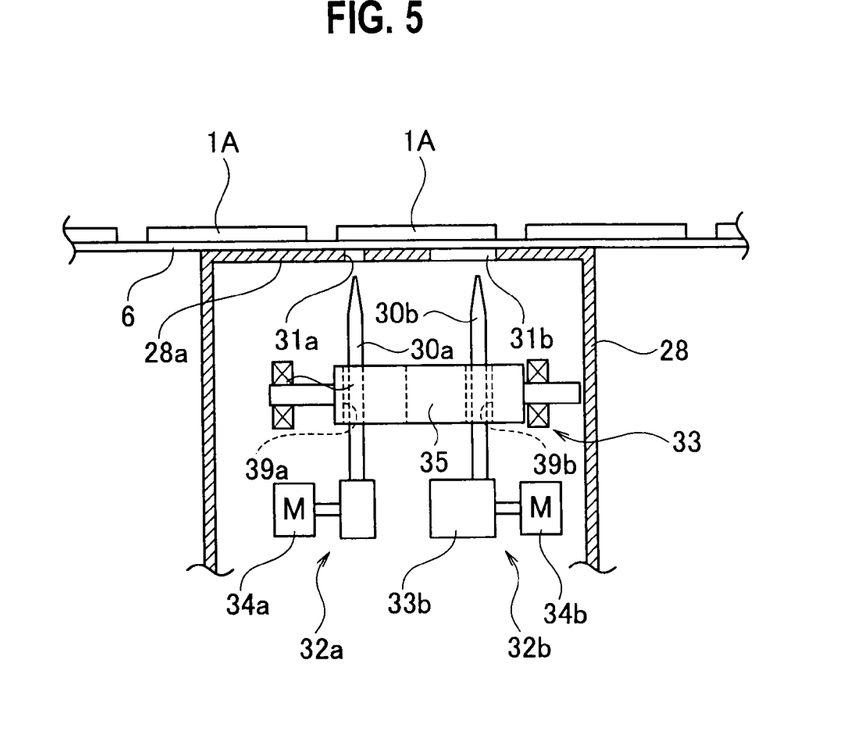
FIG. 5 is a longitudinal sectional view of the semiconductor-chip exfoliating device where an interval between the needle pins is changed.
Figure 6:
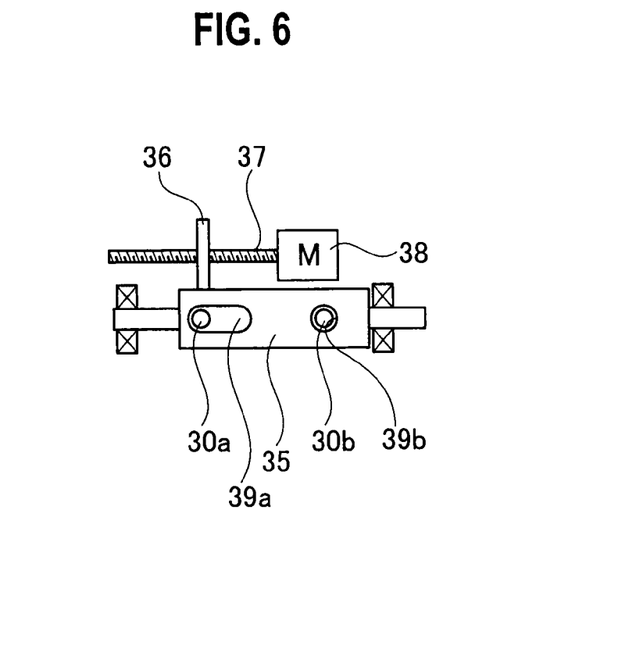
FIG. 6 is a plan view of the lift-off unit of FIG. 5.

FIGS. 5 and 6 are views explaining the operation of the lift-off unit 29 directed to semiconductor chips 1A adhered to the adhesive sheet 6, each of which is larger than the aforementioned semiconductor chip 1. In case of such a large-sized semiconductor chip, the interval between the needle pins 30a, 30b is also increased correspondingly.

When it is required to increase the interval between the needle pins 30a, 30b, the sliding unit 33 is operated to slide only the needle pin 30b on the cam 33b in a direction to depart from the other needle pin 30a. For this purpose, the motor 38 is driven to slide the slide shaft 35 to the right in the figures through the use of screw-engagement of the ball screw shaft 37 with the female screw part 36. With the sliding of the slide shaft 35 to the right, the needle pin 30b inserted into the through-hole 39b having the inner diameter somewhat larger than the outer diameter of the pin 30b is slid on the cam 33b to the right together with the slide shaft 35. While, the other needle pin 30a inserted into the through-hole 39a in the form of an elongated hole does not slide to the right due to no interference with an inner sidewall of the through-hole 39a in spite of the sliding of the needle pin 30b. In this way, the interval between the needle pins 30a, 30b is increased.

A final interval between the needle pins 30a, 30b resulting from the rightward sliding of the needle pin 30b is determined corresponding to the size of the semiconductor chip 1A to be lifted off by the needles 30a, 30b. The final interval is established so that the needle pins 30a, 30b can lift off chip's margins on both sides of the semiconductor chip 1A.

Note, the stable needle pin 30a is maintained so that its tip opposes the through-hole 31a, while the movable needle pin 30b is maintained so that its tip opposes the through-hole 31b in form of an elongated hole.

As mentioned before, the cam 33b is formed with a width "b" larger than that of the cam 33a. The formation of the cam 33b is provided for the purpose of maintaining the abutment of the cam 33b on the other end of the needle pin 30b in spite of its sliding.

As shown in FIGS. 5 and 6, after adjusting the interval between the needle pins 30a, 30b corresponding to the size of the semiconductor chip 1A, the backup holder 28 is moved to a position beneath the semiconductor chip 1A to be exfoliated from the adhesive sheet 6, similarly to the above case of exfoliating the semiconductor chip 1 and simultaneously, the decompressor is driven to allow the backup holder 28 to absorb the adhesive sheet 6 on the top wall 28a. Next, the motors 34a, 34b are driven to rotate the cams 33a, 33b, causing the needle pins 30a, 30b to be pushed up. The tips of the needle pins 30a, 30b pushed up by the cams 33a, 33b rise through the through-holes 31a, 31b to lift off the semiconductor chip 1A while being adhered to the adhesive sheet 6.

In this way, for the semiconductor chips of different sizes, it is possible to make the interval of the needle pins 30a, 30b address a target semiconductor chip, allowing an abutment of the pins 30a, 30b on the chip's margins on both sides of the chip. Thus, it is possible to exfoliate the semiconductor chips 1, 1A of difference sizes from the adhesive sheet 6 appropriately.

Figure 7A:
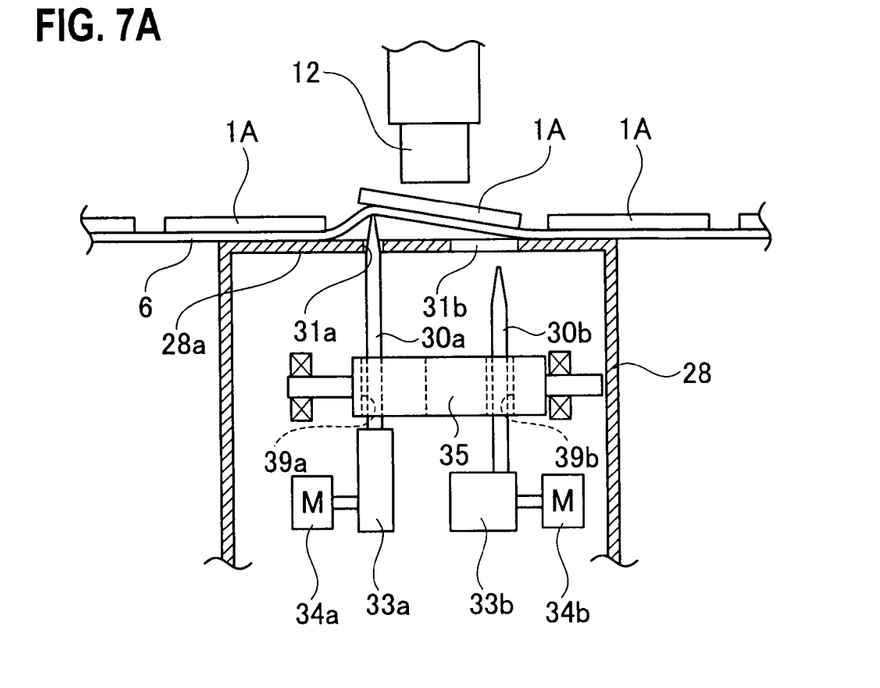

As for the lift-off timing of the needle pins 30a, 30b, there may be optionally selected either the operation mode of the same timing or the operation mode of the different timing, as similar to the above-mentioned case. When selecting the former mode of the same timing, the motors 34a, 34b are driven at the same timing, so that the needle pins 30a, 30b are lifted up at the same timing. On the other hand, when selecting the later mode of the different timing, the motors 34a, 34b are driven at the different timings, so that the needle pins 30a, 30b are lifted up one by one with a time difference. For instance, as shown in FIG. 7A, only the needle pin 30a is lifted up at first. Then, after the lapse of a predetermined time since the rising of the pin 30a, the remained needle pin 30b is lifted up as shown in FIG. 7B.

Figure 7B:
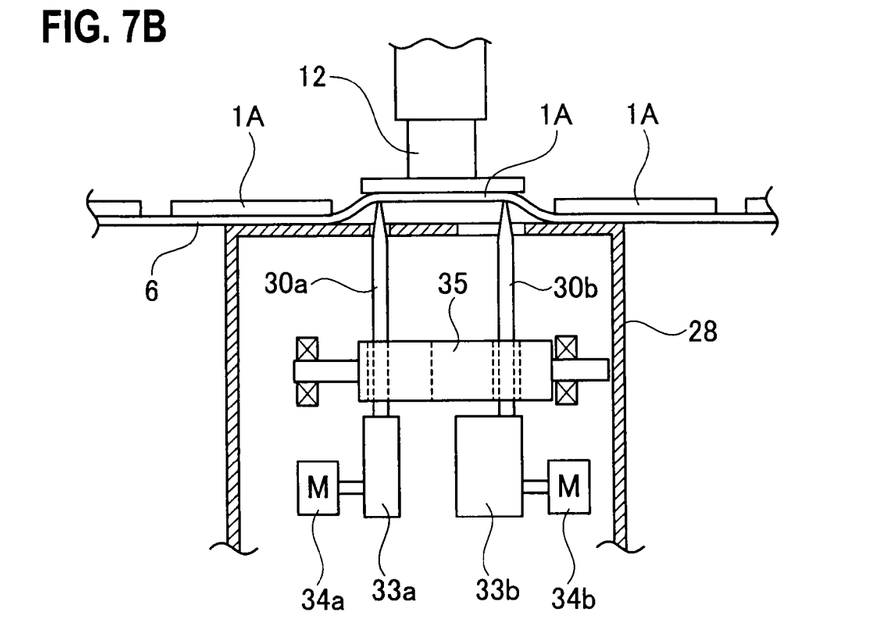

As shown in FIGS. 7A and 7B, by lifting up the needle pins 30a, 30b with a time difference therebetween, the adhesive sheet 6 beneath the semiconductor chip 1A is drawn in twice of one expansion by the needle pin 30a and another expansion by the needle pin 30b, so that the adhesive joint between the semiconductor chip 1A and the adhesive sheet 6 can be further weakened in comparison with a single expansion of the same timing, making the chip 1A easier to be exfoliated from the adhesive sheet 6.

The semiconductor chip 1A lifted off by the needle pins 30a, 30b is carried in absorption by the pickup head 12 and further delivered to the bonding tool 16 of the bonding head 15. Finally, the so-delivered semiconductor chip 1A is installed on the substrate 24 mounted on the bonding stage 23.

In this way, according to the present invention, by adjusting the interval between the lift-off pins corresponding to the size of a target semiconductor chip, it is possible to make the semiconductor chip easy to be exfoliated from the adhesive sheet despite that there is a difference in size of the semiconductor chips adhered to the adhesive sheet.

In a modification, the number of lift-off pin may be increased to lift off one semiconductor chip in more stable condition, although the illustrated embodiment adopts a pair of lift-off pins.

Additionally, the lift-off pins may be moved up and down by the other appropriate means, such as linear actuators, although they are driven due to their abutment on the eccentric cams 33a, 33b rotated by the motors 34a, 34b in the illustrated embodiment, Although the present invention has been described above by reference to one embodiment of the invention, this invention is not limited to this and modifications will occur to those skilled in the art, in light of the teachings. The scope of the invention is defined with reference to the following claims.

This application is based upon the Japanese Patent Applications No. 2007-067974, filed on Mar. 16, 2007, the entire content of which is incorporated by reference herein.

What is claimed is:

1. A semiconductor-chip exfoliating device for exfoliating a semiconductor chip from an adhesive sheet to which a plurality of semiconductor chips are adhered, comprising:
   a holder that holds the adhesive sheet so that the semiconductor chips turn upward;
   at least two first through-holes formed in the holder;
   at least two lift-off pins arranged on a backside of the holder to lift off the adhesive sheet from the holder through the first through-holes; and
   a sliding unit arranged on the backside of the holder and including a slide shaft provided with second through-holes,
   wherein the second through-holes include an elongated hole that allows an insertion of one of the lift-off pins and a relative movement of the one of the lift-off pins in a direction transverse to an axis of the one of the lift-off pins, and another hole that allows an insertion of another of the lift-off pins,
   wherein the sliding unit makes the one of the lift-off pins inserted through the elongated hole slide along the transverse direction via the slide shaft laterally with respect to the another one of the lift-off pins inserted through the another hole to thereby change an interval between the lift-off pins.

2. The semiconductor-chip exfoliating device of claim 1, wherein
   the lift-off pins are positioned so as to push against margins of the semiconductor chip on opposing sides of the semiconductor chip through the adhesive sheet.

3. The semiconductor-chip exfoliating device of claim 2, wherein
   the holder is a hollow cylinder; and
   the lift-off pins and the sliding unit are accommodated in the hollow cylinder.

4. The semiconductor-chip exfoliating device of claim 3, further comprising a decompressor for reducing a pressure inside the holder, wherein
   the holder is adapted so as to hold the adhesive sheet in absorption through the through-holes by the decompressor.

5. The semiconductor-chip exfoliating device of claim 1, wherein
   the sliding unit includes the slide shaft arranged so as to extend perpendicularly to the lift-off pins, a female screw part fixed to the slide shaft, a ball screw shaft screw-engaged with the female screw part and a motor connected to the ball screw shaft.

6. The semiconductor-chip exfoliating device of claim 1, further comprising control means configured to differentiate lift-off timings of the lift-off pins from each other, wherein
   the lift-off pins are lifted up toward the adhesive sheet with a time difference.

7. The semiconductor-chip exfoliating device of claim 1, wherein the sliding unit includes a sliding mechanism that slides the slide shaft along the transverse direction via the one of the lift-off pins inserted through the elongated hole of the slide shaft.

8. A semiconductor-device manufacturing method, comprising the steps of:
   providing a semiconductor-chip exfoliating device including:
      a holder that holds an adhesive sheet so that a plurality of semiconductor chips turn upward;
      at least two first through-holes formed in the holder;
      at least two lift-off pins arranged on a backside of the holder to lift off the adhesive sheet from the holder through the first through-holes; and
      a sliding unit arranged on the backside of the holder and including a slide shaft provided with second through-holes,
      wherein the second through-holes include an elongated hole that allows an insertion of one of the lift-off pins and a relative movement of the one of the lift-off pins in a direction transverse to an axis of the one of the lift-off pins, and another hole that allows an insertion of another of the lift-off pins,
      wherein the sliding unit makes the one of the lift-off pins inserted through the elongated hole slide along the transverse direction via the slide shaft laterally with respect to the another one of the lift-off pins inserted through the another hole to thereby change an interval between the lift-off pins;
   holding the adhesive sheet with the holder so that the semiconductor chips turn upward; and
   raising the lift-off pins to lift off the adhesive sheet from the holder, whereby one semiconductor chip can be exfoliated from the adhesive sheet.

9. The semiconductor-device manufacturing method of claim 8, further comprising the step of operating the sliding unit to slide the one of the lift-off pins inserted through the elongated hole along the transverse direction via the slide shaft with respect to the another of the lift-off pins inserted through the another hole to thereby control the interval between the lift-off pins corresponding to the size of the semiconductor chip to be exfoliated from the adhesive sheet and to exfoliate the semiconductor chip.

10. The semiconductor-device manufacturing method of claim 8, wherein
   respective timings of raising the lift-off pins are different from each other.

* * * * *